United States Patent
Iwane et al.

(10) Patent No.: US 7,788,052 B2
(45) Date of Patent: Aug. 31, 2010

(54) METHOD AND DEVICE FOR DETERMINING STATE OF HEALTH OF THE BATTERY, AND BATTERY POWER SUPPLY SYSTEM

(75) Inventors: Noriyasu Iwane, Tokyo (JP); Fumikazu Iwahana, Tokyo (JP); Atsushi Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/328,234

(22) Filed: Dec. 4, 2008

(65) Prior Publication Data

US 2009/0140744 A1    Jun. 4, 2009

Related U.S. Application Data

(63) Continuation of application No. PCT/JP2006/311638, filed on Jun. 9, 2006.

(51) Int. Cl.
*G01R 31/36* (2006.01)
(52) U.S. Cl. ............... 702/63; 702/81; 702/182; 702/183; 320/132; 320/136; 324/430; 324/426; 706/2
(58) Field of Classification Search ............ 702/81, 702/182, 183, 63; 320/118, 128, 132, 156, 320/136, 130, 134; 324/430, 426, 427; 706/2
See application file for complete search history.

(56) References Cited

U.S. PATENT DOCUMENTS

| | | | | |
|---|---|---|---|---|
| 5,369,364 | A * | 11/1994 | Renirie et al. | 324/430 |
| 6,061,638 | A * | 5/2000 | Joyce | 702/63 |
| 6,362,601 | B1 * | 3/2002 | Finger | 320/153 |
| 6,417,646 | B1 * | 7/2002 | Huykman et al. | 320/122 |
| 6,668,247 | B2 * | 12/2003 | Singh et al. | 706/2 |
| 7,019,542 | B2 * | 3/2006 | Tinnemeyer | 324/709 |
| 7,051,008 | B2 * | 5/2006 | Singh et al. | 706/2 |
| 7,446,510 | B2 * | 11/2008 | Chou et al. | 320/156 |
| 7,492,126 | B2 * | 2/2009 | Hogari et al. | 320/132 |
| 7,521,893 | B2 * | 4/2009 | Tsuchiya et al. | 320/128 |
| 7,541,814 | B2 * | 6/2009 | De Doncker et al. | 324/426 |
| 2003/0061181 | A1 * | 3/2003 | Singh et al. | 706/2 |

(Continued)

FOREIGN PATENT DOCUMENTS

JP    53-70472    6/1978

(Continued)

*Primary Examiner*—Carol S Tsai
(74) *Attorney, Agent, or Firm*—Oblon, Spivak, McClelland, Maier & Neustadt, L.L.P.

(57) ABSTRACT

A method and the device are provided for determining state of health of the battery, in addition to the power supply system using the device, to reduce operational and processing load by expanding the data sampled at the time when the battery is caused to discharge square wave pulses into the square wave is provided. The method includes determining state of health of a battery by causing the battery to discharge square wave pulses with a prescribed cycle at a prescribed current value. Response voltages are sampled at a time of a pulse-discharge. The sampled response voltages are sampled into orthogonal square wave components. An amplitude of the square wave component is divided by the current value of the pulse-discharge to obtain a pseudo-impedance. A state of health of the battery based on the pseudo-impedance is determined.

14 Claims, 4 Drawing Sheets

U.S. PATENT DOCUMENTS

| | | | |
|---|---|---|---|
| 2003/0112010 A1 * | 6/2003 | Koch | 324/427 |
| 2005/0001627 A1 * | 1/2005 | Anbuky et al. | 324/427 |
| 2005/0206348 A1 * | 9/2005 | Tsuchiya et al. | 320/156 |
| 2007/0090843 A1 * | 4/2007 | De Doncker et al. | 324/426 |
| 2009/0051364 A1 * | 2/2009 | Ishida et al. | 324/430 |

FOREIGN PATENT DOCUMENTS

| | | | |
|---|---|---|---|
| JP | 10-56744 | | 2/1998 |
| JP | 2000-299137 | | 10/2000 |
| JP | 2002044880 A | * | 2/2002 |
| JP | 2002-525586 | | 8/2002 |
| JP | 3367320 | | 11/2002 |
| JP | 2005253207 A | * | 9/2005 |
| WO | WO 00/16428 | | 3/2000 |

\* cited by examiner

METHOD AND DEVICE FOR DETERMINING STATE OF HEALTH OF THE BATTERY, AND BATTERY POWER SUPPLY SYSTEM

TECHNICAL FIELD

The present invention relates to a method and device for determining state of health of the battery and a battery power supply system.

RELATED ART

Various technologies of the method for determining state of health of the battery have been developed in a rechargeable battery in particular. Among them, the technology to determine state of health of the battery based on a measured internal impedance attracts attention (refer to Patent document 1 listed hereunder, for example). The internal impedance of the battery can be obtained by the followings: Sine wave alternative current is applied to the battery in which neither charge nor discharge is implemented, then a response voltage thereto is detected, and a prescribed arithmetic computation is carried out applying the sine wave alternative current and the response voltage.

For example, Patent document 2 listed hereunder proposes a method for determining state of health of the sealed lead acid battery based on the internal impedance. There is described that the sealed lead acid battery is discharged at a prescribed constant cycle, discharge current of a constant frequency is applied thereto, and the discharge current waveform and the voltage response waveform are Fourier transformed to calculate the internal impedance.

Patent document listed hereunder discloses that the impedance in an electrochemical device made with the electrodes inserted in the electrolyte often has frequency dependency so that it is necessary to repeatedly measure impedances in various many frequencies to fully comprehend the characteristics of the device.

The first method for calculating the internal impedance comprises the steps of applying the sine wave alternative current to the battery and calculating the internal impedance based on the response sine wave voltage variation. This method requires a large scale equipment to prepare and apply the sine wave alternative current, which causes serious problems in the cost and the size of the equipment, considering the application to the mobile phone or the application to be mounted on the vehicle.

To solve the problems mentioned above, the method for calculating the internal impedance is proposed in which instead of directly applying the sine wave alternative current, the battery is caused to perform pulse discharge with a prescribed cycle, both of the current waveform and the voltage waveform are Fourier transformed, sine components with a prescribed cycle in both of the current waveform and the voltage waveform are extracted, and then the internal impedance is calculated based on the extracted components. Thus, there is no need to produce the sine wave alternative current so as to enable to realize downsizing and lower cost in the detecting equipment.

Patent document 1: Japanese Patent Application Publication Hei 10 (1998)-56744;

Patent document 2: Japanese Patent No. 3367320; and

Patent document 3: Japanese Patent Application Publication Show 53 (1978)-070472.

DISCLOSURE OF THE INVENTION

Problem to be Solved

However, any one of the conventional method for determining state of health of the battery requires high level of trigonometric function to calculate the internal impedance so that a high performance CPU with higher cost is required to implement the calculation which results in a heavy operational load, thus causing problem.

The present invention is made to solve the above described problem and the object of the invention is to provide the method and the device for determining state of health of the battery, in addition to the power supply system using the device, which can remarkably reduce operational and processing load by expanding the data sampled at the time when the battery is caused to discharge square wave pulses into the square wave.

Means to Solve the Problem

The first embodiment of the method for determining state of health of a battery is the method comprising the steps of:

causing the battery to discharge square wave pulses with a prescribed cycle at a prescribed current value;

sampling response voltages at a time of a pulse-discharge;

expanding sampled response voltages into orthogonal square wave components;

dividing an amplitude of the square wave component by the current value of the pulse-discharge to obtain a pseudo-impedance; and determining state of health of the battery based on the pseudo-impedance.

The second embodiment of the method for determining state of health of a battery is the method comprising the steps of:

causing the battery to discharge arbitrary waveform pulses;

sampling respective current waveform and response voltage waveform at a time of pulse-discharge;

expanding sampled current waveform and response voltage waveform into at least one orthogonal square wave component;

dividing an amplitude of the square wave component of the response voltage waveform by an amplitude of the square wave component of the current waveform to obtain a pseudo-impedance; and determining state of health of the battery based on the pseudo-impedance.

In the third embodiment of the method for determining state of health of a battery, the pseudo-impedance is compensated with a prescribed compensating equation to obtain a compensated impedance, and state of health of the battery is determined based on the compensated impedance.

In the fourth embodiment of the method for determining state of health of a battery, the battery is a rechargeable battery, and the rechargeable battery is caused to discharge or charge square wave pulses with a prescribed cycle at a prescribed current value.

In the fifth embodiment of the method for determining state of health of a battery, the battery is a rechargeable battery, and the rechargeable battery is caused to discharge or charge arbitrary waveform.

The first embodiment of the device for determining state of health of a battery is the device including a discharge circuit to cause the battery to discharge pulses with prescribed cycles at prescribed current values; a memory to store sampled response voltages at a time of pulse-discharge; and a CPU inputting the response voltages from the memory, expanding the response voltages into orthogonal square wave components, dividing an amplitude of the square wave component of the response voltages by the current values of the pulse-discharge to obtain a pseudo-impedance, and determining state of health of the battery based on the pseudo-impedance.

The second embodiment of the device for determining state of health of a battery is the device including a discharge circuit to cause the battery to discharge arbitrary waveform pulses; a memory to store a sampled current waveform and response voltage waveform at a time of pulse-discharge; and a CPU inputting the current waveform and the response voltage waveform from the memory, expanding the current waveform and the response voltage waveform into at least one orthogonal square wave component, dividing an amplitude of the square wave component of the response voltage waveform by an amplitude of the square wave component of the current waveform to obtain a pseudo-impedance, and determining state of health of the battery based on the pseudo-impedance.

In the third embodiment of the device for determining state of health of a battery, the CPU compensates the pseudo-impedance with a prescribed compensating equation to obtain a compensated impedance, and state of health of the battery is determined based on the compensated impedance.

In the fourth embodiment of the device for determining state of health of a battery, the battery is a rechargeable battery, a charge circuit to cause the rechargeable battery to charge pulses with prescribed cycles at prescribed current values is further included, and the memory stores sampled response voltages at a time of a pulse-discharge or pulse-charge.

In the fifth embodiment of the device for determining state of health of a battery, the battery is a rechargeable battery, a charge circuit to cause the rechargeable battery to charge arbitrary waveform pulses is further included, and the memory stores sampled response voltage at a time of a pulse-discharge or pulse-charge.

One of the embodiments of the power supply system is the power supply system including the above described device for determining state of health of a battery in the battery.

Effect of the Invention

According to the present invention, it is possible to provide the method for determining state of health of the battery which can remarkably reduce operational and processing load by expanding the sampled data into the square wave. In addition, it is possible to determine state of health of the battery by expanding into the square wave to obtain the pseudo-impedance and applying thereof with the same preciseness as the method applying the impedance.

Furthermore, since the operational load can be remarkably reduced by the method for determining state of health of the battery of the invention, a CPU with relatively lower function can be used so as to provide the device for determining state of health of the battery and the power supply system using the same at low cost.

DESCRIPTION OF THE REFERENCE NUMERAL

1 battery
2, 11 discharge means
3 square wave expanding means
4, 14 pseudo-impedance calculating means
5, 15 state of health determining means
6, 16 response voltage
7, 17 current
8, 18 pseudo-impedance
12 first square wave expanding means
13 second square wave expanding means
21, 31 device for determining state of health
22 CPU
23 memory
24 discharge circuit
25 voltmeter
32 ammeter
41 power supply system
42 charge circuit

BEST MODE FOR CARRYING OUT THE INVENTION

Preferable embodiments of the invention are described with reference to the drawings.

Figure 1:
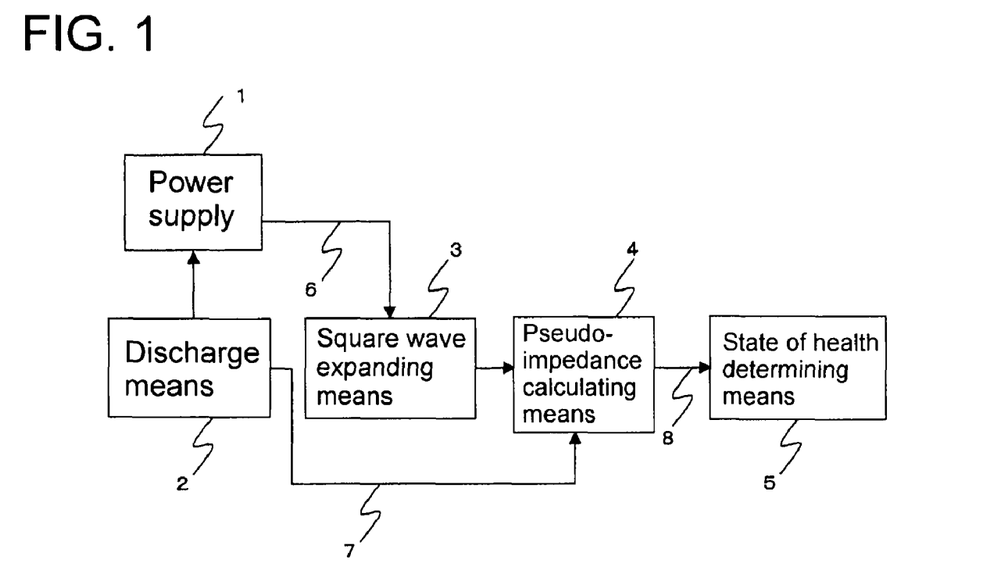
FIG. 1 is a block diagram depicting the first embodiment of the method for determining state of health of the battery of the invention.

FIG. 1 is a block diagram depicting the first embodiment of the method for determining state of health of the battery of the invention. The discharge means 2 causes the battery 1 to discharge square wave pulses with a prescribed cycle at the prescribed current value 7. This can be easily realized by opening and closing the switch in the prescribed cycle.

The square wave expanding means 3 implements sampling of the response voltage 6 when the battery 1 is caused to pulse-discharge by the discharge means 2, and expands into the orthogonal square wave components. The orthogonal square wave is expressed in general by the followings:

$$f(nt) = \begin{cases} 1: & m \cdot (T/n) \leq t < (m+1/2) \cdot (T/n) \\ -1: & (m+1/2) \cdot (T/n) \leq t < (m+1) \cdot (T/n) \end{cases} \quad \text{(equation 1)}$$

$$g(nt) = \begin{cases} -1: & m \cdot (T/n) \leq t < (m+1/4) \cdot (T/n) \\ 1: & (m+1/4) \cdot (T/n) \leq t < (m+3/4) \cdot (T/n) \\ -1: & (m+3/4) \cdot (T/n) \leq t < (m+1) \cdot (T/n) \end{cases} \quad \text{(equation 2)}$$

Where, T is the cycle of the fundamental wave (i.e., the wave with the lowest frequency), and equal to the cycle of the pulse discharge, n is the natural number minus (−) the order of the square wave (f(nt), g(nt) respectively represents the 1/n cycle of the square wave of the cycle T of the fundamental wave), m is an arbitrary natural number.

When the response voltage 6 is expressed by V(t), applying the orthogonal square wave expressed by the equations 1 and 2, $$V(t) = a0 + \Sigma an \cdot f(nt) + \Sigma bn \cdot g(nt) \quad \text{(equation 3)}$$

Σ is a total of n=1~∞

The coefficient in the equation 3 can be obtained by the following equation:

$$an = (1/T) \int f(nt) \cdot V(t) \cdot dt \quad \text{(equation 4)}$$

$$bn = (1/T) \int g(nt) \cdot V(t) \cdot dt \quad \text{(equation 5)}$$

∫ is the integral of t=0~T.

The operation of the above respective integrals can be calculated, in the same manner as the discrete Fourier expansion in the sine wave, by sampling V(t) for one cycle (=T) at the prescribed sampling interval Δt, and operating quadrature by parts. The square wave expanding means 3 calculates, for example, the coefficient a1 in the fundamental frequency based on the above equation.

The pseudo-impedance calculating means 4 inputs the coefficient a1 calculated by the square wave expanding means 3 on one hand, and inputs the current value 7 from the discharge means 2, when the battery 1 is caused to pulse-discharge, on the other hand. The pseudo-impedance 8 is calculated by dividing the coefficient a1 by the current value 7, without implementing the trigonometric function operation. It is possible to perform the sampling of the current as the current value 7 when the battery 1 is caused to pulse-discharge, and apply the same.

The state of health determining means 5 inputs the pseudo-impedance calculated by the pseudo-impedance calculating means 4, and determines state of health of the battery 1 (i.e., whether the battery 1 is deteriorated or not), by a method of determining whether the pseudo-impedance 8 exceeds a prescribed limit or not, for example.

In the prior art, the true (practical) impedance is obtained and applied to determine state of health of the battery, whereas in the present invention, the pseudo-impedance described above is applied to determine state of health of the battery 1, in place of the true impedance. This is based on a new finding that there is a linear correlation between the pseudo-impedance obtained by square wave expanding in the invention and the impedance obtained by the sine wave expanding (i.e., Fourier expanding) in the prior art.

Figure 2:
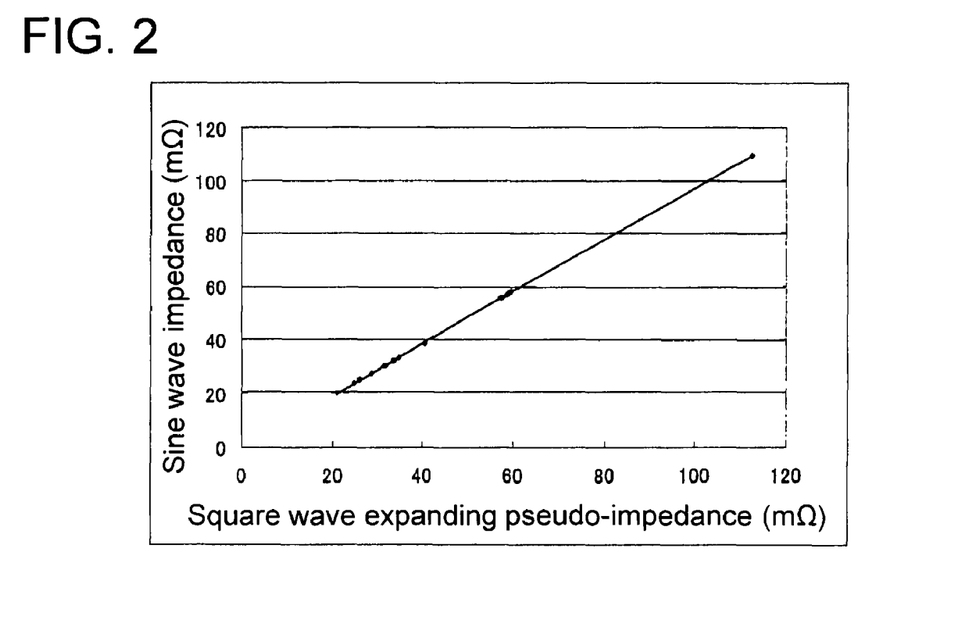
FIG. 2 is a graph showing correlation between pseudo-impedance obtained by expanding into the square wave and the impedance obtained by expanding into sine wave.

The correlation between the pseudo-impedance obtained by the square wave expanding and the impedance obtained by the sine wave expanding is depicted in FIG. 2. When the pseudo-impedance obtained by the square wave expanding is expressed by x, and the impedance obtained by the sine wave expanding is expressed by y, it is evident from FIG. 2 that the linear relation as expressed by the equation y=c·x+d is substantially satisfied. Here, the coefficient c and d can be decided from FIG. 2.

As described above, according to the first embodiment of the invention, it becomes possible to determine state of health of the battery with the substantially same precision as the method applying the true impedance. Furthermore, in case that the response voltage 6 is expanded into the square waves applying the equations 1 to 5, it becomes possible to remarkably reduce the operational load of CPU, since the operation is implemented for the respective zones which have the identical value in the equation 1 or 2 to simplify the processing, and in addition, it requires no operation of the trigonometric function which has a heavy operational load.

Although the pseudo-impedance 8 is applied as it is for determining state of health of the battery 1 in the first embodiment of the invention, it is also possible to apply the impedance compensated based on the correlation equation between the square waves expanded pseudo-impedance and the sine wave expanded impedance as depicted in FIG. 2. More specifically, the above described correlation equation y=c x+d is obtained from FIG. 2, then the pseudo-impedance is compensated by the correlation equation, and then thus compensated impedance is applied to determine state of health of the battery 1. Accordingly, the precision of the determination can be remarkably improved.

Figure 3:
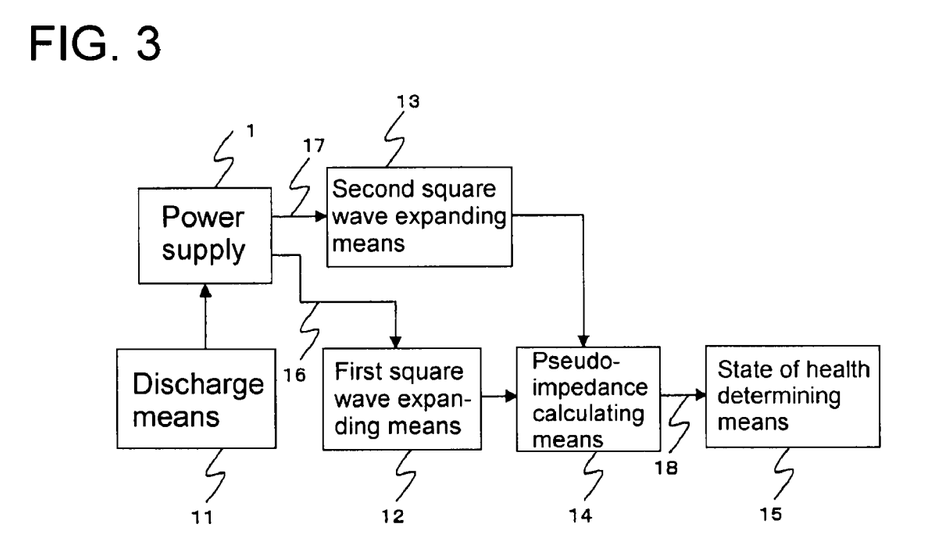
FIG. 3 is a block diagram depicting the second embodiment of the method for determining state of health of the battery of the invention.

The second embodiment of the method for determining state of health of the battery of the invention is described with reference to FIG. 3. In this embodiment, the pulse discharge with arbitrary waveform is applied to determine state of health of the battery, in place of the pulse discharge with the square wave.

The discharge means 11 causes the battery 1 to pulse-discharge with a prescribed waveform. The above-described prescribed waveform can be arbitrarily prepared and applied. The arbitrarily prepared waveform can be set in advance in the discharge means 11. The square wave can be surely used as the arbitrary waveform.

The first square wave expanding means 12 implements sampling of the response voltage 16 when the battery 1 is caused to pulse-discharge by the discharge means 11, and expands into the orthogonal square wave component. Here, the square wave expanding means 12 calculates, for example, the coefficient a1' (the coefficient a1 in the first embodiment) in the fundamental frequency, in the same manner.

The second square wave expanding means 13 implements sampling of the current 17 when the battery 1 is caused to pulse-discharge by the discharge means 11, and expands into the orthogonal square wave component. Although the equation 3 expands the response voltage into the square wave component, the current 17 can be expanded into the square wave component in the same manner as in the equation 3. Concerning the current 17, the second square wave expanding means 13 calculates, for example, the coefficient a1" (discriminated from the coefficient a1, a1') in the fundamental frequency, in the same manner.

The pseudo-impedance calculating means 14 inputs the coefficient a1' calculated by the first square wave expanding means 12 and the coefficient a1" calculated by the second square wave expanding means 13. The pseudo-impedance 18 is calculated by dividing the coefficient a1' by the coefficient a1".

The state of health determining means 15 inputs the pseudo-impedance 18 calculated by the pseudo-impedance calculating means 14, and determines state of health of the battery 1 (i.e., whether the battery 1 is deteriorated or not), by the same method as that in the first embodiment. Furthermore, as the same as the first embodiment, the pseudo-impedance is compensated by the correlation equation y=c·x+d, and then thus compensated impedance is applied to determine state of health of the battery 1. Accordingly, the precision of the determination can be remarkably improved.

The embodiment in which the battery 1 is caused to pulse-charge to determine state of health of the battery 1 is described above. In case that the battery is a rechargeable battery, the battery 1 can be caused to pulse-charge to determine state of health of the battery. To do so, the charge means to cause the battery to pulse-charge is to be installed in place of the charge means 2 in the first embodiment or the charge means 11 in the second embodiment. Alternatively, the method is to be designed such that the pulse discharge and the pulse charge can be selectively performed.

Figure 4:
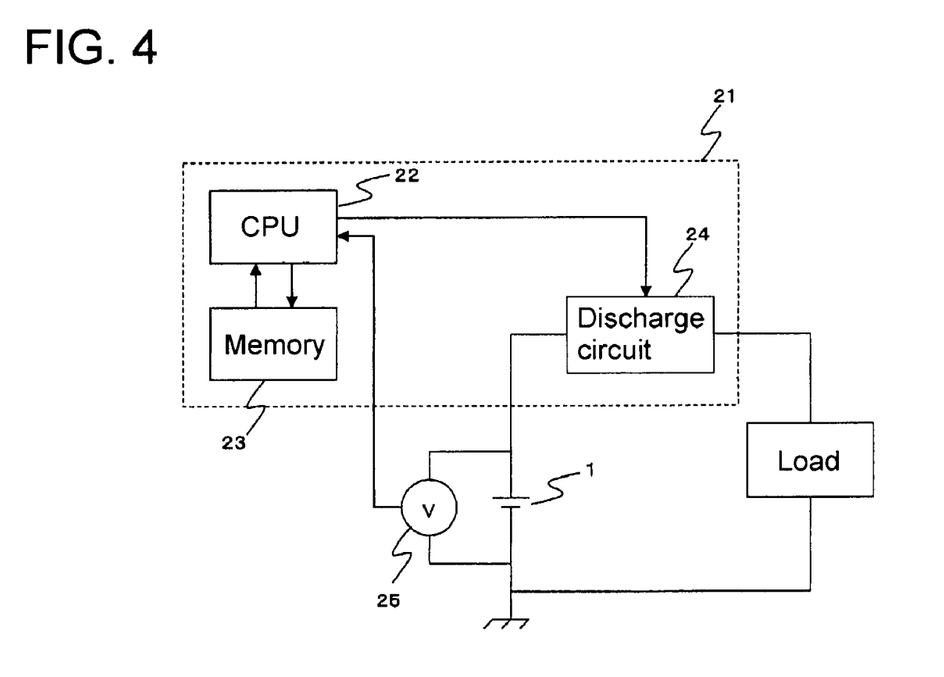
FIG. 4 is a block diagram showing the device for determining state of health of the battery which realizes the method for determining state of health of the battery in the first embodiment of the invention.

A device for determining state of health of the battery of the invention is described with reference to the drawings. FIG. 4 is a block diagram showing the device for determining state of health of the battery which realizes the method for determining state of health of the battery in the first embodiment of the invention. The device 21 for determining state of health of the battery comprises a CPU 22, a memory 23 and a discharge circuit 24. The discharge circuit 24 corresponds in function to the discharge means 2. In case that the battery 1 is the rechargeable battery, a charge circuit can be further added to the device 21 to be applied for determining state of health of the battery.

A program of determining state of health of the battery to realize the method for determining state of health of the battery in the first embodiment of the invention, and a program of voltage-sampling to perform sampling of the voltage measured by the voltmeter 25 are installed in the CPU 22, and each of the programs is processed in response to the requirement of the outside.

When the processing of the program of determining state of health of the battery is started, the pulse-discharge with the substantial square wave is requested to the discharge circuit 24. When the pulse-discharge is implemented in the discharge circuit 24, the response voltage at the time is measured by the voltmeter 25. Then, the measured response voltage is sampled by means of the program of voltage-sampling to perform sampling of the voltage, and stored in the memory 23.

Following the sampling of the response voltage for a prescribed time period by means of the program of voltage-sampling to perform sampling of the voltage, the response voltage is expanded into the square wave by means of the square wave expanding means 3 in the program of determining state of health of the battery. Following that, the pseudo-impedance calculating means 4 and the determining means 5 of state of health are executed to determine state of health of the battery 1.

Figure 5:
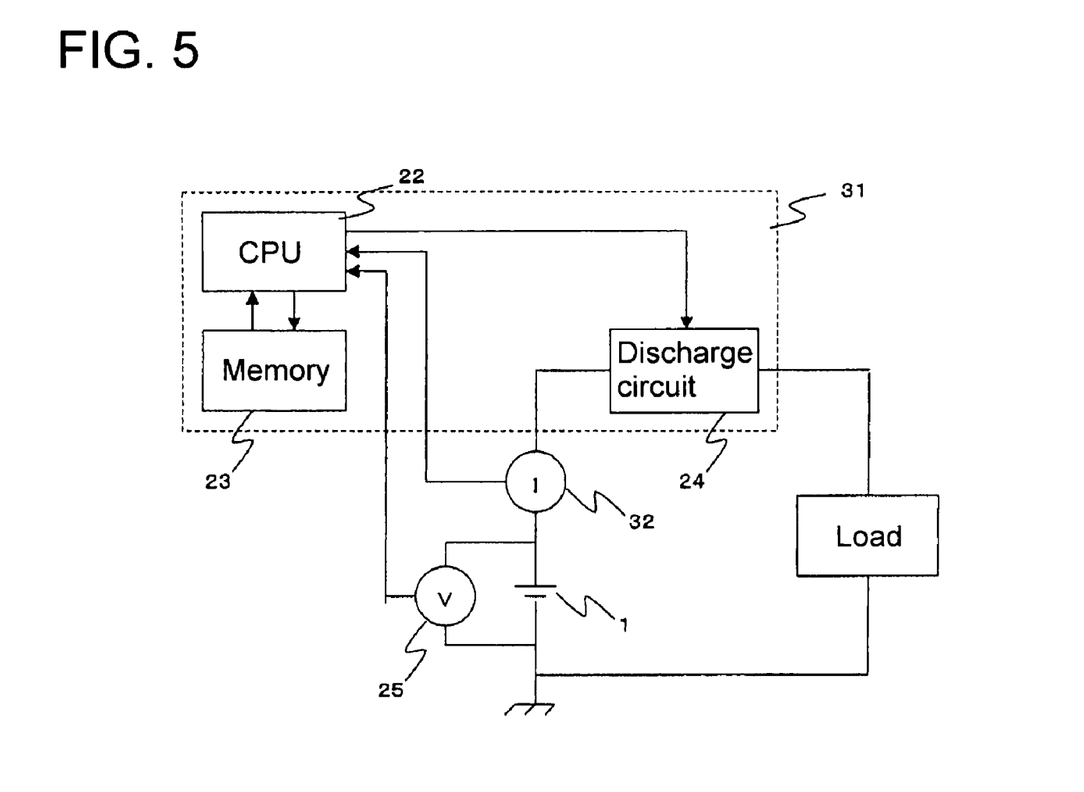
FIG. 5 is a block diagram showing the device for determining state of health of the battery which realizes the method for determining state of health of the battery in the second embodiment of the invention.

Another device for determining state of health of the battery to realize the method for determining state of health of the battery in the second embodiment of the invention is described with reference the block diagram depicted in FIG. 5. The construction of the device 31 for determining state of health of the battery is the same as the device 21 for determining state of health of the battery except that the current is inputted from the ammeter 32. In addition, the device 31 is the same as the device 21 in that the charge circuit is further added to the device 31 in case that the battery 1 is the rechargeable battery.

In addition to a program of determining state of health of the battery and a program of voltage-sampling to realize the method for determining state of health of the battery in the second embodiment of the invention, a program of current-sampling to perform sampling of the current measured by the ammeter 32 and to store the same in the memory 23 are installed in the CPU 22 of the device 31 for determining state of health of the battery, and each of the programs is processed in response to the requirement of the outside.

When the processing of the program of determining state of health of the battery is started, first of all, the pulse-discharge with arbitrary waveform is requested to the discharge circuit 24. When the pulse-discharge is implemented in the discharge circuit 24, the current and the response voltage at the time are respectively measured by the ammeter 32 and the voltmeter 25. Then, the measured current and the response voltage are sampled by means of the program of current-sampling and the program of voltage-sampling to perform sampling of the current and the voltage, and stored in the memory 23.

Following the sampling of the current and the response voltage for a prescribed time period by means of the program of current-sampling and the program of voltage-sampling to perform sampling of the current and the voltage, the processing of the other program of determining state of health of the battery is implemented in the same manner as that in the device 21 for determining state of health of the battery to determine state of health of the battery 1.

Figure 6:
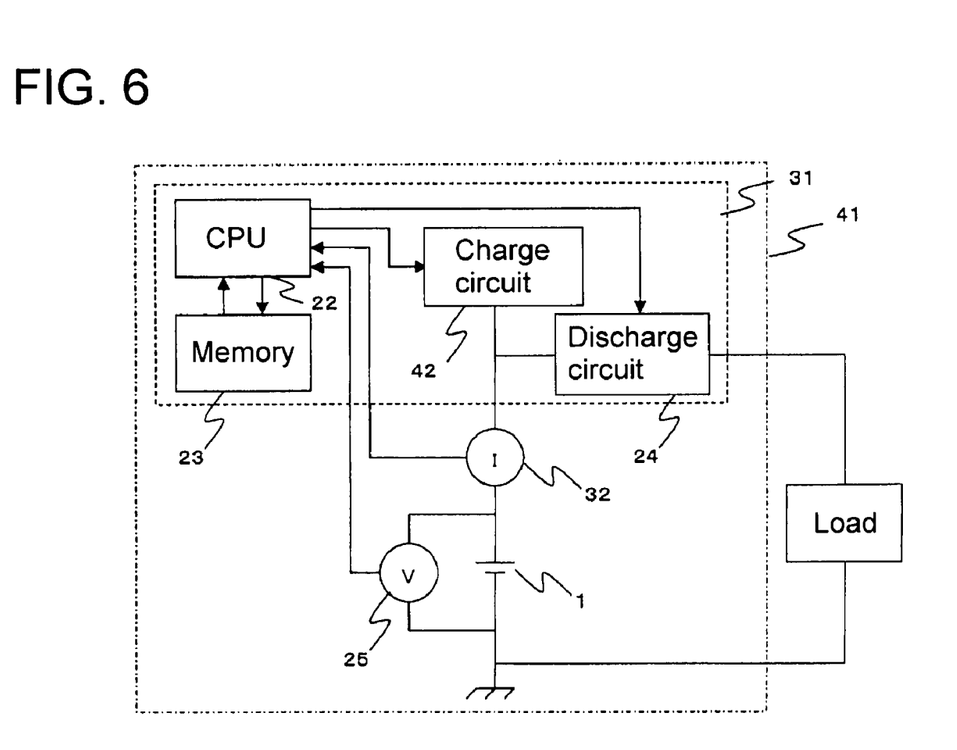
FIG. 6 is a block diagram showing a power supply system including the device for determining state of health of the battery of the invention.

FIG. 6 depicts one example of a power supply system including the above described device 31 for determining state of health of the battery of the invention. The example as depicted in FIG. 6 is the power supply system 41 in which the battery 1 is the rechargeable battery, and the device 31 for determining state of health of the battery includes the charge circuit 42 in addition to the charge circuit 24. It is also possible to provide the power supply system including the device 21 for determining state of health of the battery, as well as the example depicted in FIG. 6.

A CPU with relatively lower performance can be applied to the CPU 22 in the above described device 21 or 31 for determining state of health of the battery of the invention. More specifically, in the conventional device, the response voltage or the like is Fourier-transformed with the use of the trigonometric function which has a heavy operational load. In the present invention, the response voltage or the like is processed by means of the square wave expanding, thus enabling to remarkably reduce the load of the CPU. Accordingly, the requirement of the performance of the CPU installed in the device 21 or 31 for determining state of health of the battery can be lowered comparing with the conventional device, thus enabling to largely lower the cost for the CPU.

The specification is based on the Japanese Patent Application No. 2005-108,565 filed on Apr. 5, 2005, the entirety of which is incorporated herein.

What is claimed is:

1. A method for determining state of health of a battery comprising the steps of:
 causing the battery to discharge square wave pulses with a prescribed cycle at a prescribed current value;
 sampling response voltages at a time of a pulse-discharge;
 expanding sampled response voltages into orthogonal square wave components;
 dividing an amplitude of the square wave component by the current value of the pulse-discharge to obtain a pseudo-impedance; and
 determining state of health of the battery based on the pseudo-impedance.

2. A method for determining state of health of a battery comprising the steps of:
 causing the battery to discharge arbitrary waveform pulses;

sampling respective current waveform and response voltage waveform at a time of pulse-discharge;
expanding sampled current waveform and response voltage waveform into at least one orthogonal square wave component;
dividing an amplitude of the square wave component of the response voltage waveform by an amplitude of the square wave component of the current waveform to obtain a pseudo-impedance; and
determining state of health of the battery based on the pseudo-impedance.

3. The method for determining state of health of a battery according to claim 1 or 2, wherein the pseudo-impedance is compensated with a prescribed compensating equation to obtain a compensated impedance, and state of health of the battery is determined based on the compensated impedance.

4. The method for determining state of health of a battery according to claim 1, wherein the battery is a rechargeable battery, and the rechargeable battery is caused to discharge or charge square wave pulses with a prescribed cycle at a prescribed current value.

5. The method for determining state of health of a battery according to claim 2, wherein the battery is a rechargeable battery, and the rechargeable battery is caused to discharge or charge arbitrary waveform.

6. A device for determining state of health of a battery including a discharge circuit to cause the battery to discharge pulses with prescribed cycles at prescribed current values;
a memory to store sampled response voltages at a time of pulse-discharge; and a CPU inputting the response voltages from the memory, expanding the response voltages into orthogonal square wave components, dividing an amplitude of the square wave component of the response voltages by the current values of the pulse-discharge to obtain a pseudo-impedance, and determining state of health of the battery based on the pseudo-impedance.

7. A device for determining state of health of a battery including a discharge circuit to cause the battery to discharge arbitrary waveform pulses; a memory to store a sampled current waveform and response voltage waveform at a time of pulse-discharge; and a CPU inputting the current waveform and the response voltage waveform from the memory, expanding the current waveform and the response voltage waveform into at least one orthogonal square wave component, dividing an amplitude of the square wave component of the response voltage waveform by an amplitude of the square wave component of the current waveform to obtain a pseudo-impedance, and determining state of health of the battery based on the pseudo-impedance.

8. The device for determining state of health of a battery according to claim 6 or 7, wherein the CPU compensates the pseudo-impedance with a prescribed compensating equation to obtain a compensated impedance, and state of health of the battery is determined based on the compensated impedance.

9. The device for determining state of health of a battery according to claim 6, wherein the battery is a rechargeable battery, a charge circuit to cause the rechargeable battery to charge pulses with prescribed cycles at prescribed current values is further included, and the memory stores sampled response voltages at a time of a pulse-discharge or pulse-charge.

10. The device for determining state of health of a battery according to claim 7, wherein the battery is a rechargeable battery, a charge circuit to cause the rechargeable battery to charge arbitrary waveform pulses is further included, and the memory stores sampled response voltage at a time of a pulse-discharge or pulse-charge.

11. A power supply system including the device for determining state of health of a battery in the battery according to any one of claims 6, 7, 9, and 10.

12. The method for determining state of health of a battery according to claim 3, wherein the battery is a rechargeable battery, and the rechargeable battery is caused to discharge or charge arbitrary waveform.

13. The method for determining state of health of a battery according to claim 3, wherein the battery is a rechargeable battery, and the rechargeable battery is caused to discharge or charge square wave pulses with a prescribed cycle at a prescribed current value.

14. A power supply system including the device for determining state of health of a battery in the battery according to claim 8.

* * * * *